US006365848B1

(12) United States Patent
Maple

(10) Patent No.: US 6,365,848 B1
(45) Date of Patent: Apr. 2, 2002

(54) KEY PANEL AND STRIP SWITCH ASSEMBLY CONFIGURATIONS HAVING VARIABLE ASPECT RATIOS AND METHOD OF MAKING

(75) Inventor: Larry E Maple, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/514,213

(22) Filed: Feb. 25, 2000

(51) Int. Cl.[7] ........................ H01H 13/705; H01H 1/10; H05K 1/00; H05K 7/00

(52) U.S. Cl. ........................ 200/5 A; 200/512; 200/292; 361/680; 361/749

(58) Field of Search ................................ 200/5 A, 5 R, 200/86 R, 512–517, 292, 293–296; 174/250–268; 361/679–681, 748, 749; 341/22–35

(56) References Cited

U.S. PATENT DOCUMENTS 3,911,234 A * 10/1975 Kotaka ........................ 200/5 A
4,066,850 A * 1/1978 Heys, Jr. ................ 361/749 X
4,246,452 A * 1/1981 Chandler .................... 200/5 A
4,450,324 A * 5/1984 Fukukura et al. ........... 200/5 A
4,929,807 A * 5/1990 Sorenson .................... 200/296
5,610,602 A 3/1997 Hargreaves .................. 341/22
5,612,692 A 3/1997 Dugas et al. ................. 341/22
5,717,431 A 2/1998 Chia-Ying et al. .......... 345/168
6,068,416 A * 5/2000 Kumamoto et al. .... 200/344 X

OTHER PUBLICATIONS

"Intaq Keypanel Selection and Specification Guide", Delltron Company, 6 pages (undated).
"Membrane Keypanels", Intaq Electrotouch Systems, 4 pages, 1994.
"Successful product development depends on knowing a good idea when you see one", Shin–Etsu Polymer America, Inc., 18 pages (undated).

* cited by examiner

*Primary Examiner*—J. R. Scott

(57) ABSTRACT

A key panel includes a key panel configuration having a number of switch locations arranged in a pattern so as to define an aspect ratio for the key panel configuration. A strip of switch material having an aspect ratio that is greater than the aspect ratio of the key panel configuration and having a number of switches that is at least equal to the number of switch locations for the key panel configuration is provided with at least one fold therein so as to arrange the number of switches on the strip of switch material in the pattern defined by the key panel configuration.

21 Claims, 4 Drawing Sheets

KEY PANEL AND STRIP SWITCH ASSEMBLY CONFIGURATIONS HAVING VARIABLE ASPECT RATIOS AND METHOD OF MAKING

FIELD OF INVENTION

The present invention relates to key panels in general and more specifically to a key panel formed from a single strip of switch material and a method for making the key panel.

BACKGROUND

Key panels or keyboards have been used for decades to provide input and control instructions to electronic devices and systems. Early key panel systems were discrete systems, typically comprising an array of individual mechanical switches arranged and mounted so as to form the desired key panel configuration. For example, early QWERTY (e.g., typewriter-style) key panel systems were constructed according to this architecture. However, besides being cumbersome, heavy, and prone to malfunction due to foreign object contamination, such discrete type key panel or keyboard systems are expensive and difficult to produce.

Partly in an effort to solve some of the problems associated with discrete component key panel systems, key panel systems have been developed in which the various switches are provided on thin, flexible substrates or membranes. Such key panel systems are often generically referred to as membrane type key panel systems. While many different types of membrane type key panel systems exist and are being used, a typical membrane type key panel system comprises a laminated or layered structure in which a bottom membrane layer or sheet is provided with a plurality of switch elements that correspond to each desired input key. An overlying flexible layer or membrane may be provided with one or more raised portions or "domes" thereon that are aligned with the switch contacts provided on the bottom layer or membrane. Each switch on the bottom membrane may be actuated by depressing the corresponding dome on the overlying or top layer. Membrane type key panels of the type just described have become very popular and are widely used in modern electronic devices and systems due to their reliable operation, light weight, and rugged construction.

One problem that remains with such membrane type key panel systems is that they are not readily adaptable to varying panel or keyboard configurations. As an example, a currently available membrane type key system is produced as a two dimensional sheet or panel having a size and shape that corresponds to the specific key panel layout for the particular device in which the key panel is to be used. Therefore, if the key panel layout is changed, an entirely new sheet or panel of the switch membrane material must be produced that corresponds to the changed key panel layout. Moreover, if a user desires to utilize a key panel configuration wherein the keys are placed around the periphery of the panel, such as for example, if the keys are to be placed around a centrally located two dimensional display device (e.g., a CRT or and LCD display), the sheet material located in the corresponding central region of the key panel will need to be removed, thus wasted, in order to accommodate the display device. Such waste increases the overall cost of the key panel device. Another disadvantage associated with currently available membrane type key panel systems is that two dimensional sheets or panels are difficult to ship and store, particularly if the key panel in which they are to be used is relatively large.

SUMMARY OF THE INVENTION

A key panel according to one preferred embodiment of the invention includes a key panel configuration having a number of switch locations arranged in a pattern so as to define an aspect ratio for the key panel configuration. A strip of switch material having an aspect ratio that is greater than the aspect ratio of the key panel configuration and having a number of switches that is at least equal to the number of switch locations for the key panel configuration is provided with at least one fold therein so as to arrange the number of switches on the strip of switch material in the pattern defined by the key panel configuration.

Also disclosed is a method for fabricating a key panel that comprises the steps of: Selecting a key panel configuration having a number of switch locations arranged in a pattern so as to define an aspect ratio for the key panel configuration; selecting a strip of switch material having an aspect ratio that is greater than the aspect ratio of the key panel configuration, the strip of switch material also having a number of switches that is at least equal to the number of switch locations for the key panel configuration; and folding the strip of switch material so as to arrange the number of switches provided on the strip of switch material in the pattern defined by the key panel configuration.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
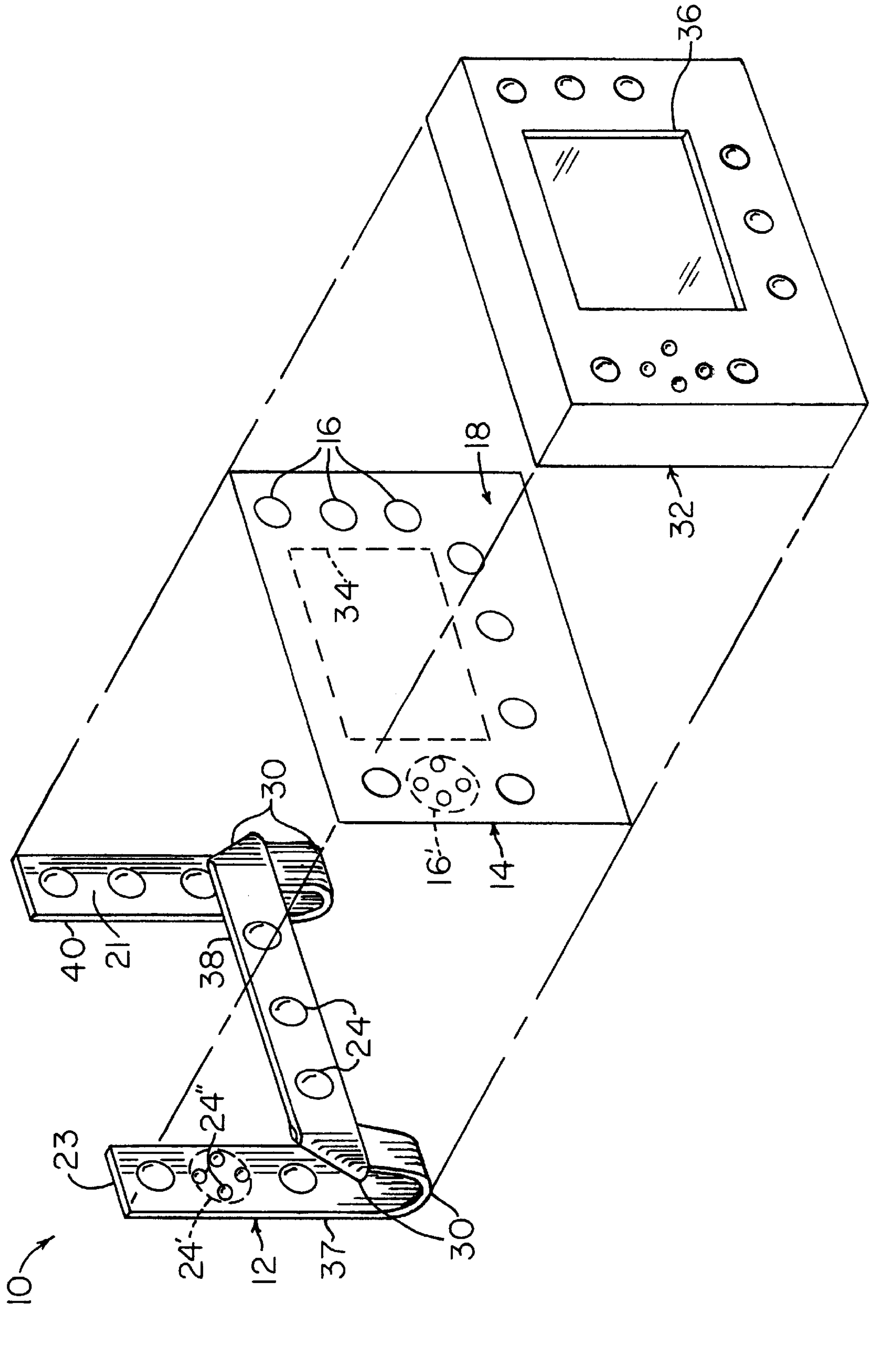
FIG. 1 is an exploded perspective view of a key panel assembly according one embodiment of the present invention showing the positional relationship between a strip of switch material used to form the key panel, a key panel configuration, and a key panel bezel.
Figure 2:
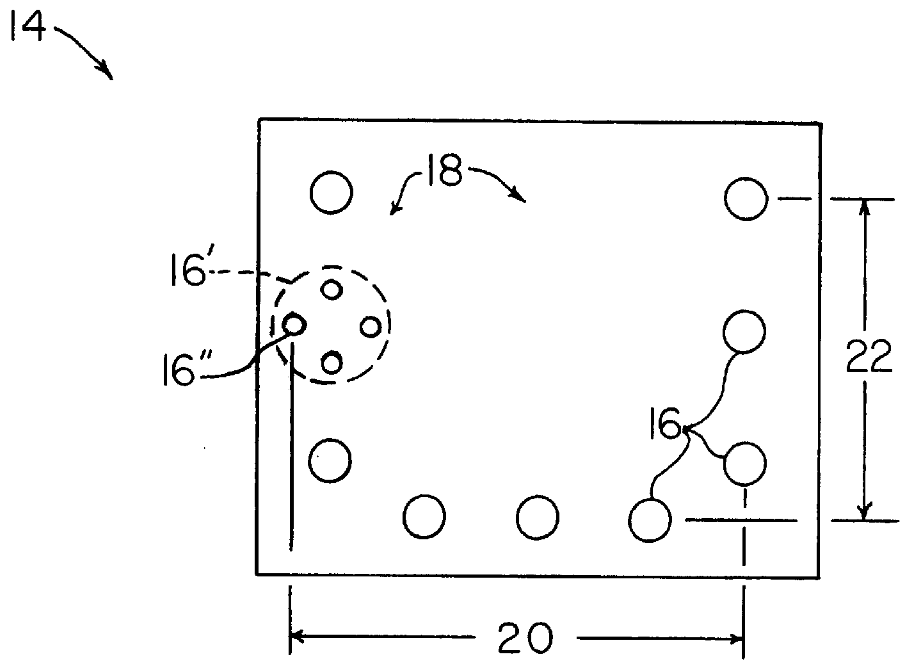
FIG. 2 is a front view in elevation of the key panel configuration shown in FIG. 1 showing the switch locations and their arrangement in a switch pattern.

A key panel assembly 10 according to one preferred embodiment of the present invention is best seen in FIG. 1 and may comprise a strip of switch material 12 folded so that it conforms to a desired key panel configuration 14. As will be described in greater detail below, the key panel configuration 14 is not necessarily a physical element but instead represents a desired configuration for the key locations for a desired device (not shown), such as a portable or hand-held scanner device. By way of example, in the embodiment shown in FIG. 1, the key panel configuration 14 may comprise a generally rectangular shape having a number of switch locations 16 arranged in a generally U-shaped pattern 18. The arrangement of the switch locations 16 in the pattern 28 defines an aspect ratio for the key panel configuration 14. With reference to FIG. 2, the aspect ratio for the key panel configuration 14 is defined as the ratio of the overall length 20 between the switch locations 16 that are separated by the greatest distance along the length direction and the overall width 22 between the switch locations that are separated by the greatest distance along the width direction. Expressed algebraically, the aspect ratio is the overall length 20 divided by the overall width 22.

Figure 3:
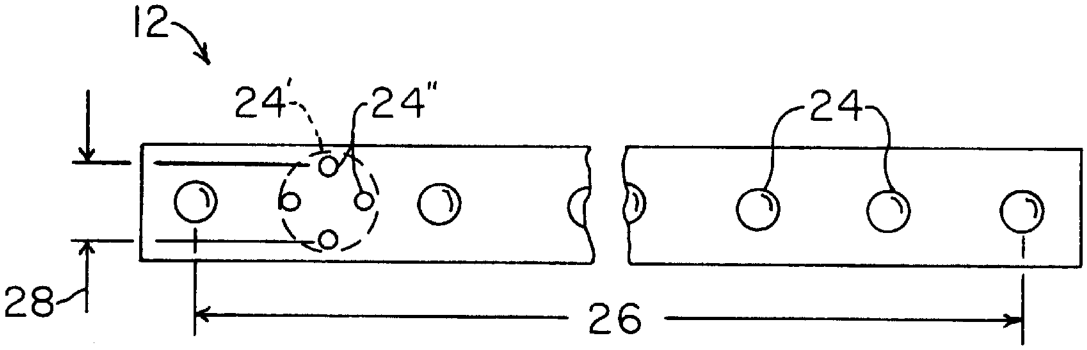
FIG. 3 is a front view in elevation of the strip of switch material before it is folded into the key panel configuration.

With reference now to FIG. 3, the strip of switch material 12 may comprise an elongate, generally flexible member having a front side 21 and a back side 23. One or more switches 24 are provided on the strip of switch material 12. The switches 24 on the strip of switch material 12 define an aspect ratio for the strip of switch material 12. The aspect ratio for the strip of switch material 12 is defined as the ratio of the overall length 26 between the switches 24 that are located at either end of the strip of switch material 12 and the overall width 28 between the switches 24 that are separated by the greatest distance along the width direction. Expressed algebraically, the aspect ratio of the strip of switch material 12 is the overall length 26 divided by the overall width 28.

The key panel assembly 10 according to the present invention is formed by selecting a strip of switch material 12 having a numerical aspect ratio (i.e., the overall length 26 of the strip of switch material 12 divided by overall width 28 of the strip of switch material) that is greater than the numerical aspect ratio (i.e., overall length 20 of the key panel configuration 14 divided by overall width 22 of the key panel configuration 14) of the key panel configuration 14. The strip of switch material 12 should also contain at least as many switches 24 as their are switch locations 16 in the key panel configuration 14. The strip of switch material 12 is then provided with one or more folds 30 so as to arrange the various switches 24 provided on the strip of switch material 12 in accordance with the pattern 18 defined by the key panel configuration 14. Stated another way, the strip of switch material 12 is folded so that each switch 24 is positioned at the corresponding switch location 16 provided on the key panel configuration 14. See FIG. 1. Once properly configured (e.g., by folding) the strip of switch material 12 may then be incorporated into the device (not shown) in which the key panel assembly 10 is to be used. For example, in one preferred embodiment, the folded and configured strip of switch material 12 may be affixed to a subpanel 42 (FIG. 4) associated with the device (not shown) and covered with a control panel bezel 32 (FIG. 1).

A significant advantage of the key panel assembly 10 according to the present invention is that it allows the key panel 10 to be formed with a single, continuous strip of switch material 12, thereby eliminating much of the waste typically associated with prior key panels formed from two-dimensional sheets of key switch material (not shown). For example, in the embodiment shown in FIG. 1, a key panel fabricated from a two-dimensional sheet (not shown) about the same size as the rectangular key panel configuration 14 would include a large waste area roughly corresponding to an area 34 on the key panel configuration 14 that is devoid of switches. That is, the waste area on the two-dimensional sheet of key panel material would be about the same size as a display window 36 provided on the bezel assembly 32. The present invention eliminates such waste in that the strip of switch material need not be positioned in the waste area 34.

Another advantage of the present invention is that it allows key panels having almost any size and shape (i.e., key panel configuration) to be manufactured from a single, continuous strip of switch material 12 by simply folding and bending the strip of switch material 12 as necessary to form the desired configuration. Accordingly, the present invention also eliminates the need to provide separate, and typically custom-designed, two-dimensional key panel sheets for a given product or product line. The present invention thus represents a paradigm shift: It allows membrane type key panels to be fabricated from a single strip of switch material as opposed to using a larger two-dimensional sheet or panel of membrane type switch material.

Still other advantages are associated with the strip of switch material 12. For example, the flexible nature of the strip of switch material 12 allows the material to be used to form three-dimensional key panel configurations, i.e., configurations wherein switches may be located on a front surface, a side surface, and a back surface of the device. The strip of switch material 12 may also be used with curved key panel configurations in which a given surface of the key panel may be curved in three dimensions.

Having briefly described one embodiment of the key panel 10, as well as some of its more significant features and advantages, the various embodiments of the key panel according to present invention will now be described in detail. However, before proceeding with the detailed description, it should be noted that only a limited number of configurations and examples for the key panel are shown and described herein. Many other configurations are possible and may be used in any of a wide variety of applications. Indeed, the key panel assembly according to the present invention may be used in almost any configuration and for and device imaginable, be it a currently existing device, or some device yet to be developed. Consequently, the present invention should not be regarded as limited to the particular configurations, applications, and devices shown and described herein.

With the foregoing considerations in mind, one embodiment of the key panel assembly 10 according to the present invention is best seen in FIGS. 1–4 as it may be used to form the key panel associated with a portable or hand-held scanner device (not shown). The bezel assembly 32 of such a portable or hand-held scanner device is shown in FIG. 1. As mentioned above, the functional and/or aesthetic requirements of the particular device in which the key panel assembly 10 is to be used will lead a designer to develop a key panel configuration 14 which defines a variety of switch locations 16 arranged in a pattern 18. Of course, the exact number of switch locations 16 and the particular pattern 18 in which they are arranged will vary from device to device. However, mindful of a few simple design constraints (discussed below) associated with the strip of switch material 12, a designer will be able to utilize the strip of switch material 12 in almost any key panel configuration 14 that can be imagined.

Continuing now with the description, in the device represented by the example shown in FIG. 1, the key panel configuration 14 may comprise a plurality of switch locations 16 arranged in a generally U-shaped pattern 18. It should be noted that the key panel configuration is not necessarily a physical device or structure and could instead simply comprise a plan or construct used to guide the development of the device and to define the locations of the various switches to be contained in the key panel. Consequently, the present invention should not be regarded as limited to a physical key panel configuration 14. In the example shown in FIG. 1, the key panel configuration 14 may also be provided with a multi-switch location 16' which may comprise four individual switch locations 16" arranged in a group to define the multi-switch location 16'. Such multi-switch locations 16' may be accommodated by the present invention by providing the strip of switch material 12 with a corresponding grouping 24' of individual switches 24", as discussed below. Alternatively, such multi-switch locations 16' need not be provided.

The pattern 18 of switch locations 16 defining the key panel configuration 14 also define an aspect ratio for the key panel configuration 14. Referring now to FIG. 2, the aspect ratio of the key panel configuration 14 is the ratio of the overall length 20 to the overall width 22 of the switch locations 16 defining the key panel configuration. Stated arithmetically, the aspect ratio of the key panel configuration 14 is the overall length 20 of the key panel configuration 14 divided by the overall width 22 of the key panel configuration 14. Specifically, the overall length 20 is defined as the length between the center lines of the two switch locations 16 that are separated by the greatest distance in the length direction. For example, in the embodiment shown in FIG. 2, the overall length 20 of the key panel configuration 14 is the distance separating the center line of the left-most small switch location 16"in the multi-switch location 16' and the center line of any of the right-most switch locations 16, since those switch locations 16 are all substantially co-linear.

The overall width 22 of the key panel configuration 14 is defined as the length between the center lines of the two switch locations 16 that are separated by the greatest distance in the width direction. In the embodiment shown in FIG. 2, the overall width 22 of the key panel configuration 12 is the distance separating the center lines of any of the lower-most switch locations 16, since they are all substantially co-linear, and the center lines of either of the upper-most switch locations 16, since they are also substantially co-linear.

The strip of switch material 12 is best seen in FIG. 3 and may comprise an elongate, generally flexible member having a front side 21 and a back side 23. The strip of switch material 12 may also be provided with a plurality of switches 24 which are operable from the front side 21 of the strip of switch material 12. Generally speaking, and as will be discussed in greater detail below, each switch 24 provided on the strip of switch material 12 may be substantially identical to the others and may be located at substantially evenly spaced locations along the length of the strip of switch material 12. However, other configurations are possible. For example, in the embodiment shown and described herein wherein the key pad configuration is provided with at least one multi-switch location 16', the strip of switch material 12 may be provided with a corresponding grouping 24' of individual switches 24", as best seen in FIGS. 1 and 3.

The arrangement of switches (e.g., 24, 24") on the strip of switch material 12 defines an aspect ratio for the strip of switch material 12. As used herein, the aspect ratio of the strip of switch material 12 is the ratio of the overall length 26 to the overall width 28. Expressed arithmetically, the aspect ratio of the strip of switch material 12 is the overall length 26 divided by the overall width 28. The overall length 26 is defined as the distance separating the center lines of the two switches 24 that are located the greatest distance apart along the length direction, i.e., the distance between center lines of the two switches 24 that are located at opposite ends of the strip of switch material 12. For example, in the embodiment shown in FIG. 3, the overall length 26 of the strip of switch material 12 is defined as that distance separating the center line of the left-most switch 24 and the center line of the right-most switch 24.

The overall width 28 of the strip of switch material 12 is the distance separating the center lines of the two switches 24 that are located the greatest distance apart in the width direction. For example, in the embodiment illustrated in FIG. 3, the overall width 28 is the distance between the center line of the upper-most switch 24" and the center line of the lower-most switch 24" contained in the group of switches 24'. Alternatively, if no grouping of switches 24' is provided, and the strip of switch material 12 comprises a single, substantially colinear row of switches 24, then the width dimension 28 should be regarded as unity in order to avoid an indefinite aspect ratio when expressed arithmetically.

The relationship between the aspect ratios of the key panel configuration 14 and the strip of switch material 12 provides a convenient method for defining a part of the invention. That is, if the aspect ratio (expressed arithmetically) of the strip of switch material 12 is greater than the aspect ratio (expressed arithmetically) of the key panel configuration 14, then the strip of switch material 12 may be regarded as being used in accordance with the teachings of the present invention. Stated another way, the strip of switch material 12 may be regarded as a one-dimensional array of switches 24. Therefore, the use of the strip of switch material 12 in a key panel configuration 14 having a lower aspect ratio essentially amounts to a use of the one-dimensional array of switches 24 contained in the strip of switch material 12 to form a two-dimensional array of switches in the desired key panel assembly 10. The aspect ratio measure is used to cover a situation, such as that illustrated in FIGS. 1–3, where one or more switch locations 16 in the key panel configuration 14 may comprise a group 16' of multiple switch locations 16". Absent the aspect ratio definitions provided herein, a strip of switch material 12 having a corresponding group 24' of switches 24" would not be properly regarded as a strictly one-dimensional array of switches.

Continuing now with the description, the strip of switch material 12 should include at least as many switches 24 as there are switch locations 16 in the key panel configuration 14. If the strip of switch material 12 contains switches 24 in excess of the number of switch locations 16, such additional switches 24 will simply remain unused in the final key panel assembly 10. Referring back now to FIG. 1, the strip of switch material 12 may be provided with one or more folds 30 in order to arrange the various switches 24, 24" provided on the strip of switch material 12 so that the switches 24, 24" may be arranged to conform to the switch pattern 18 defined by the key panel configuration 14.

For example, in the embodiment illustrated in FIG. 1, the strip of switch material 12 may be configured to conform to the key panel configuration 14 by first folding the vertical portion 37 of the strip of switch material 12 upwardly and then by folding it outwardly. The two folds 30 serve to reconfigure the switches 24 on the strip 12 so that they extend along a substantially horizontal portion 38. The strip of switch material 12 is then folded twice again so as to reconfigure the remaining switches 24 on the strip 12 so that they extend along a substantially vertical portion 40. After having been folded, the strip of switch material 12 may then be secured to a subpanel 42 (FIG. 4), if desired, and connected to the electrical circuitry (not shown) associated with the device (also not shown). An optional bezel 32 (FIG. 1) may then be secured over the key panel assembly 10, as will be discussed in greater detail below.

It should be noted that the radius (not shown) of each fold 30 should be greater than or equal to the minimum bend radius associated with the particular type of switch material that is used to form the strip of switch material 12. So limiting the minimum radius of the various folds 30 will ensure reliable and long-lived operation of the key panel assembly 10. Since the minimum bend radius of the switch material 12 will vary depending on the particular configuration and structural attributes of the switch material, as described in greater detail below, the present invention should not be regarded as limited to materials having any particular minimum bend radius.

The strip of switch material 12 may comprise any of a wide range of flexible, membrane-type switch devices that are well-known in the art and that are readily commercially available. For example, in one preferred embodiment, the strip of switch material 12 may comprise a flexible membrane switch assembly available from GM Nameplate, Intaq Electrotouch Systems, of Seattle, Wash. Alternatively, similar membrane type switches are available from Shin-Etsu Polymer of Union City, Calif. One configuration of such a membrane type switch will now be described in order to provide a better framework for understanding the invention.

Figure 4:
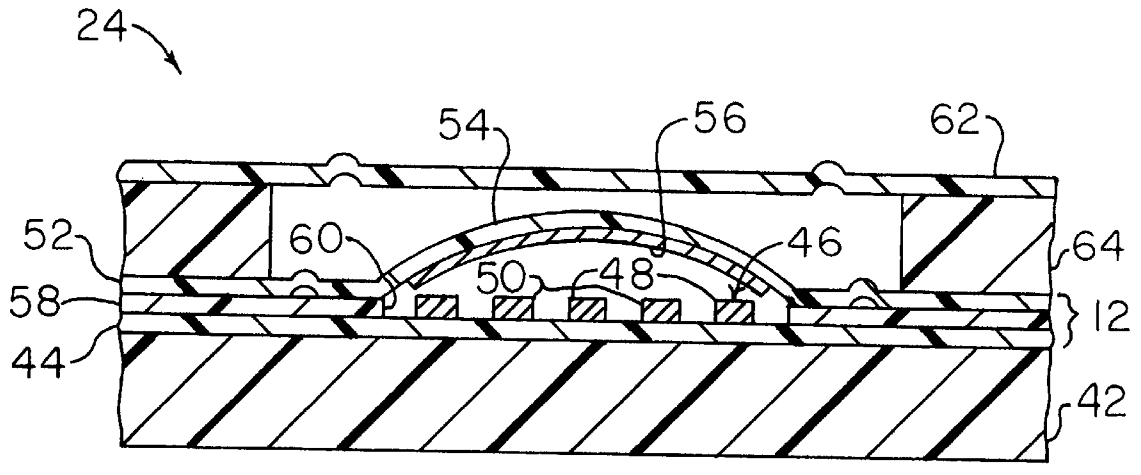
FIG. 4 is an enlarged sectional view in elevation of the key panel assembly shown in FIG. 1.

Referring now to FIG. 4, one embodiment of the strip of switch material 12 may comprise a generally flexible, membrane type switch material comprising a generally flexible bottom membrane 44 having at least one switch contact 46 formed thereon. While a wide variety of switch contacts 46 are known for such devices, in one preferred embodiment switch contact 46 may be formed from first and second conductive elements 48 and 50 deposited on the bottom membrane 44. The first and second conductive elements 48 and 50 may be electrically connected together to close the switch. A top membrane 52 having at least one dome 54 formed thereon may be positioned over the switch contact 46 so that an electrically conductive portion 56 of dome 54 will electrically connect together at least portions of the first and second conductive elements 48 and 50 when the dome 54 is depressed. The foregoing switch structure is generically referred to in the art as a “membrane switch,” although other terms are also used to describe this structure.

Depending on the particular membrane type switch configuration that is used, the top membrane 52 may be separated from the bottom membrane 44 by a spacer 58. Spacer 58 defines an opening 60 therein that is aligned with the switch contact 46 and the dome 54. Optionally, an overlay member 62 may be positioned over the top membrane 52 to protect the same from wear, foreign objects, and/or liquids. Overlay member 62 may be separated from the top membrane 52 by a spacer member 64. Finally, and as mentioned above, the lower membrane 44 may be positioned adjacent a subpanel member 42 which provides support for the strip of switch material 12. If necessary or desired in any particular application, the lower membrane 44 may be affixed to the subpanel member 42 by any of a wide range of adhesive materials that are readily commercially available for such purposes.

Figure 5:
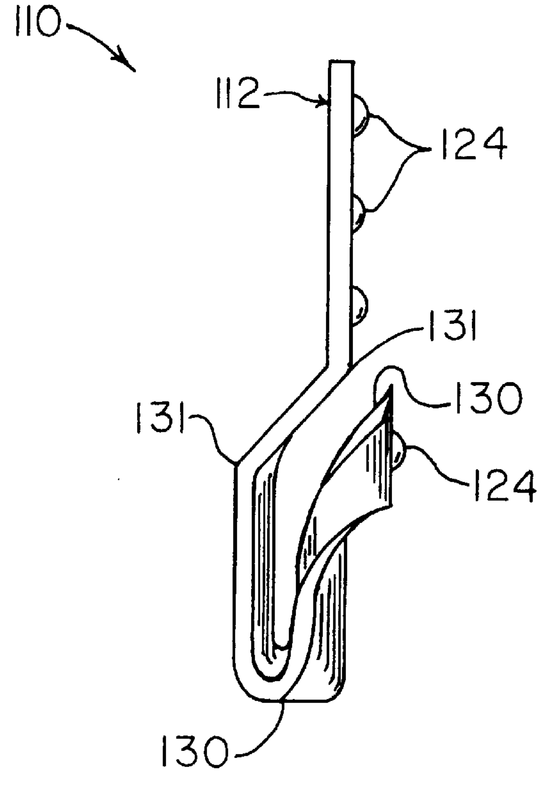
FIG. 5 is a side view in elevation of a second embodiment of a strip of switch material having an offset fold to make substantially coplanar the various switch domes forming the key panel configuration.

Depending on the requirements of the particular device in which the key panel assembly 10 is to be used, it may be required, or at least desirable, to configure the key panel 10 so that all of the switches 24 provided thereon are substantially co-planar. With reference now to FIG. 5, a second embodiment 110 of the key panel assembly illustrated in FIG. 1 may be provided with a strip of switch material 112 having a plurality of additional folds 131 provided therein in order to position the switches 124 provided therein so that the switches 124 that are to be used are all substantially co-planar. In the example shown and described herein, the folds 131 are in addition to folds 130 which may be used to align the various switches 124 in the pattern (e.g., the pattern 18 shown in FIG. 1) defined by the particular key panel configuration (e.g., the key panel configuration 14 shown in FIG. 1). As mentioned above, each fold 130, 131 should have a radius (not shown) equal to or greater than the minimum bend radius associated with the particular switch material used.

Figure 6:
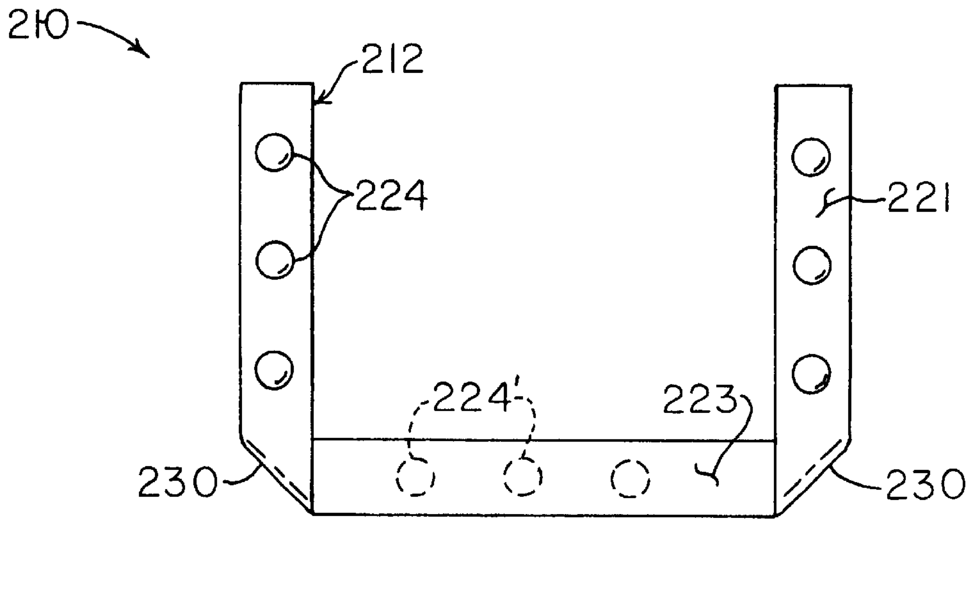
FIG. 6 is a front view in elevation of a third embodiment of a strip of switch material having two single folds to position the various switch domes on opposite sides of the strip of switch material.

Still other arrangements are possible. For example, with reference now to FIG. 6, a third embodiment 210 of a key pad assembly may comprise a strip of switch material 212 folded so that at least one switch 224 is located on the front side 221 of the strip of switch material 212 and so that at least one switch 224' is located on the back side 223 of the strip of switch material 212. In the embodiment shown in FIG. 6, this configuration may be obtained by providing the strip of switch material 212 with two folds 230 as shown.

Figure 7:
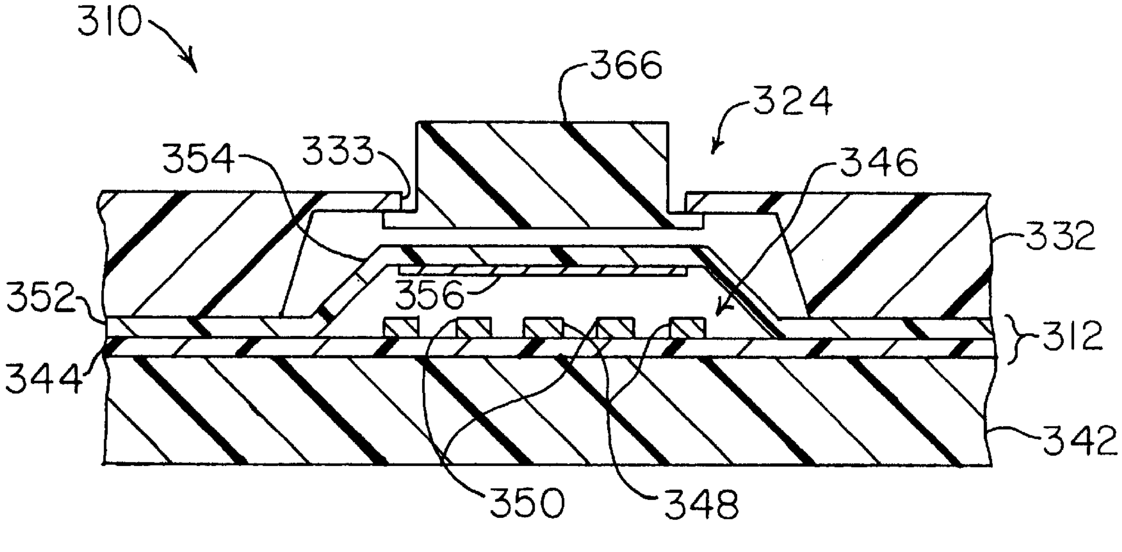
FIG. 7 is an enlarged sectional view in elevation of a fourth embodiment of a key panel assembly according to the present invention.

As mentioned above, the strip of switch material (e.g., 12, 112, 212) may comprise any of a wide range of flexible materials having switches provided thereon that may be folded in accordance with the present invention in order to form the key panel assembly (e.g., 10, 110, 210) of the present invention. For example, another embodiment 310 of a key panel assembly is shown in FIG. 7 and may comprise a strip of switch material 312 comprising a generally flexible bottom membrane 344 having at least one switch contact 346 provided thereon. Switch contact 346 may comprise first and second conductive elements 348 and 350 positioned in spaced-apart relation on the bottom membrane 344. A top membrane 352 having a dome 354 provided thereon may be positioned over the bottom membrane 344. The dome 354 may be provided with an electrically conductive region 356 thereon so that when dome 354 is depressed, the electrically conductive region 356 will electrically connect at least portions of the first and second conductive elements 348 and 350, thus closing the switch 324. The key panel assembly 310 may be provided with a key top 366 positioned over the dome 354. A bezel 332 defining an opening 333 therein may also be provided to hold key top 366 in position. Finally, the bottom membrane 344 may be positioned adjacent a subpanel 342 which provides support for the strip of switch material 312. Optionally, the bottom membrane 344 may be attached to the subpanel 342 by any suitable adhesive material.

It is contemplated that the inventive concepts herein described may be variously otherwise embodied and it is intended that the appended claims be construed to include alternative embodiments of the invention except insofar as limited by the prior art.

What is claimed is:

1. A key panel, comprising:

a key panel configuration having a number of switch locations arranged in a pattern so as to define an aspect ratio for said key panel configuration; and a strip of switch material having an aspect ratio that is greater than the aspect ratio of said key panel configuration, said strip of switch material also having a number of switches that is at least equal to the number of switch locations for said key panel configuration, said strip of switch material having at least one fold formed therein so as to arrange in the pattern the number of switches provided on said strip of switch material.

2. The key panel of claim 1, further comprising a subpanel, said strip of switch material being positioned in contact with said subpanel, said subpanel providing support for said strip of switch material.

3. The key panel of claim 2, wherein said strip of switch material is affixed to said subpanel.

4. The key panel of claim 2, further comprising an overlay member positioned over said strip of switch material so that said strip of switch material is positioned between said overlay member and said subpanel.

5. The key panel of claim 1, wherein said strip of switch material comprises:

a bottom membrane having at least one switch contact thereon; and a top membrane having at least one dome formed thereon, said top membrane being positioned adjacent said bottom membrane so that said at least one dome formed on said top membrane is aligned with said at least one switch contact on said bottom membrane so that said at least one dome closes said at least one switch contact when said at least one dome is depressed.

6. The key panel of claim 5, wherein said at least one switch contact provided on said bottom membrane comprises a first electrically conductive trace and a second electrically conductive trace, said first and second electrically conductive traces being positioned in spaced-apart relationship on said bottom membrane, and wherein said at least one dome formed on said top membrane comprises an electrically conductive portion, said electrically conductive portion on said at least one dome contacting at least portions of both said first and second electrically conductive traces on said bottom membrane when said at least one dome is depressed.

7. The key panel of claim 5 further comprising a spacer defining at least one opening therein, said spacer being positioned between said bottom membrane and said top membrane so that said at least one opening in said spacer is aligned with said at least one switch contact provided on said bottom membrane.

8. The key panel of claim 5, further comprising at least one key top positioned over said at least one dome formed on said top membrane, said at least one key top actuating said at least one switch contact provided on said bottom membrane when said key top is depressed.

9. The key panel of claim 8, further comprising a bezel defining at least one opening therein sized to receive said at least one key top, said bezel being positioned over said top membrane member so that said at least one key top protrudes through said at least one opening provided in said bezel.

10. The key panel of claim 1, wherein said strip of switch material comprises a front side and a back side, each of said switches provided in said strip of switch material being actuated from the front side of said strip of switch material.

11. The key panel of claim 10, wherein said key panel configuration defines a front side and a back side and wherein said strip of switch material is folded so that at least one of said switches is located on the front side of said key panel configuration and so that at least one of said switches is located on the back side of said key panel configuration.

12. The key panel of claim 1, wherein said strip of membrane type switch material comprises:

a bottom membrane having at least one switch contact thereon;

a spacer defining at least one opening therein, said spacer being positioned adjacent said bottom membrane so that said at least one opening in said spacer is aligned with said at least one switch contact provided on said bottom membrane; and a top membrane having at least one dome formed thereon, said top membrane being positioned adjacent said spacer so that said at least one dome formed on said top membrane is aligned with said at least one opening in said spacer so that said at least one dome closes said at least one switch contact when said at least one dome is depressed.

13. The key panel of claim 12, further comprising an overlay member positioned over said top membrane.

14. The key panel of claim 12, wherein said at least one switch contact provided on said bottom membrane comprises a first electrically conductive trace and a second electrically conductive trace, said first and second electrically conductive traces being positioned in spaced-apart relationship on said bottom membrane, and wherein said at least one dome formed on said top membrane includes an electrically conductive portion provided thereon, said electrically conductive portion on said at least one dome contacting portions of both said first and second electrically conductive traces on said bottom membrane when said at least one dome is depressed.

15. A key panel, comprising:

a key panel configuration having a number of switch locations arranged in a pattern so as to define an aspect ratio for said key panel configuration; and switch material strip means having an aspect ratio that is greater than the aspect ratio of said key panel configuration for providing switches at the switch locations and in the pattern defined by said key panel configuration.

16. The key panel of claim 15, further comprising subpanel means positioned adjacent said switch material strip means for supporting said switch material strip means.

17. The key panel of claim 15, further comprising overlay means positioned over said switch material strip means for protecting said switch material strip means.

18. The key panel of claim 15, further comprising key top means positioned over said switch material strip means for actuating said switch material strip means.

19. The key panel of claim 15, further comprising bezel means having an opening therein sized to receive said key top means, said bezel means positioned over said switch material strip means for holding said key top means adjacent said switch material strip means and for allowing said key top means to project through the opening in said bezel means.

20. A method for fabricating a key panel, comprising:

selecting a key panel configuration having a number of switch locations arranged in a pattern so as to define an aspect ratio for said key panel configuration;

selecting a strip of switch material having an aspect ratio that is greater than the aspect ratio of said key panel configuration, said strip of switch material also having a number of switches that is at least equal to the number of switch locations for said key panel configuration; and folding said strip of switch material so as to arrange in the pattern the number of switches provided on said strip of switch material.

21. A method for fabricating a key panel, comprising:

selecting a key panel configuration having a number of switch locations arranged in a pattern so as to define an aspect ratio for said key panel configuration;

fabricating a strip of switch material having an aspect ratio that is greater than the aspect ratio of said key panel configuration, said strip of switch material also having a number of switches that is at least equal to the number of switch locations for said key panel configuration; and folding said strip of switch material so as to arrange in the pattern the number of switches provided on said strip of switch material.

* * * * *